United States Patent
Mücklich et al.

(10) Patent No.: US 7,063,896 B2
(45) Date of Patent: Jun. 20, 2006

(54) METALLIC SURFACE OF A BODY, METHOD FOR PRODUCING A STRUCTURED METALLIC SURFACE OF A BODY AND THE USE THEREOF

(75) Inventors: Frank Mücklich, Schwalbach (DE); Harald Schorr, Stuttgart (DE); Peter Rehbein, Weissach (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/489,837

(22) PCT Filed: Sep. 19, 2002

(86) PCT No.: PCT/DE02/03503

§ 371 (c)(1),
(2), (4) Date: Oct. 6, 2004

(87) PCT Pub. No.: WO03/028159

PCT Pub. Date: Apr. 3, 2003

(65) Prior Publication Data

US 2005/0048308 A1  Mar. 3, 2005

(30) Foreign Application Priority Data

Sep. 19, 2001  (DE) ............................. 101 46 274

(51) Int. Cl.
*B32B 15/00* (2006.01)
*B32B 3/10* (2006.01)
*H01R 13/03* (2006.01)
*H01R 43/00* (2006.01)
*C22F 1/08* (2006.01)
*C22F 1/00* (2006.01)

(52) U.S. Cl. .............. 428/614; 428/647; 428/648; 428/687; 428/929; 439/886; 439/887; 148/525; 148/536; 148/537; 427/123; 427/126.1; 427/383.7; 427/597; 219/121.6; 219/121.77

(58) Field of Classification Search .............. None
See application file for complete search history.

(56) References Cited

U.S. PATENT DOCUMENTS 3,629,022 A * 12/1971 Terry ........................... 438/648

(Continued)

FOREIGN PATENT DOCUMENTS

| JP | 63-169352 | * | 7/1988 |
| JP | 05-177548 | * | 7/1993 |
| JP | 10 302 867 | | 11/1998 |

* cited by examiner

Primary Examiner—John J. Zimmerman
(74) Attorney, Agent, or Firm—Kenyon & Kenyon LLP

(57) ABSTRACT

A method is proposed for preparing a structured metallic surface of a body or for the structuring close to the surface or the generation of metallic structures, first of all on a first metal layer or on a first intermetallic layer a second metal layer or a second intermetallic layer, the second layers differing from the first layers, being generated; and thereafter at least the second metal layer or the second intermetallic layer being heated up region by region in such a way that, in that location, there is formed an intermetallic compound using the material of the first intermetallic layer or the first metal layer and the material of the second metal layer or the second intermetallic layer, into which surface regions are embedded, which are at least essentially made of the material of the second metal layer or the second intermetallic layer. In addition to that, a metallic surface of a body is proposed, especially a surface of a plug or an electrical contact element for the electrical contacting or connection of component parts, having such a structure.

20 Claims, 2 Drawing Sheets

U.S. PATENT DOCUMENTS

| | | | |
|---|---|---|---|
| 4,233,185 A * | 11/1980 | Knapton et al. | 502/304 |
| 4,608,085 A * | 8/1986 | Eudier et al. | 75/247 |
| 4,693,942 A * | 9/1987 | Shimizu et al. | 428/614 |
| 4,783,384 A * | 11/1988 | Van Beek et al. | 429/223 |
| 4,975,355 A * | 12/1990 | Suzuki | 430/270.13 |
| 5,300,157 A * | 4/1994 | Okabe et al. | 148/437 |
| 5,916,695 A | 6/1999 | Fister et al. | |
| 6,040,067 A | 3/2000 | Sugawara et al. | |
| 6,096,445 A * | 8/2000 | Terakado et al. | 428/848.3 |
| 6,332,728 B1 * | 12/2001 | Ito et al. | 401/215 |
| 6,776,726 B1 * | 8/2004 | Sano | 473/330 |
| 2001/0012490 A1 * | 8/2001 | Yamauchi | 419/6 |
| 2001/0019779 A1 * | 9/2001 | Sakai et al. | 428/553 |
| 2002/0025448 A1 * | 2/2002 | Yamaguchi | 428/610 |

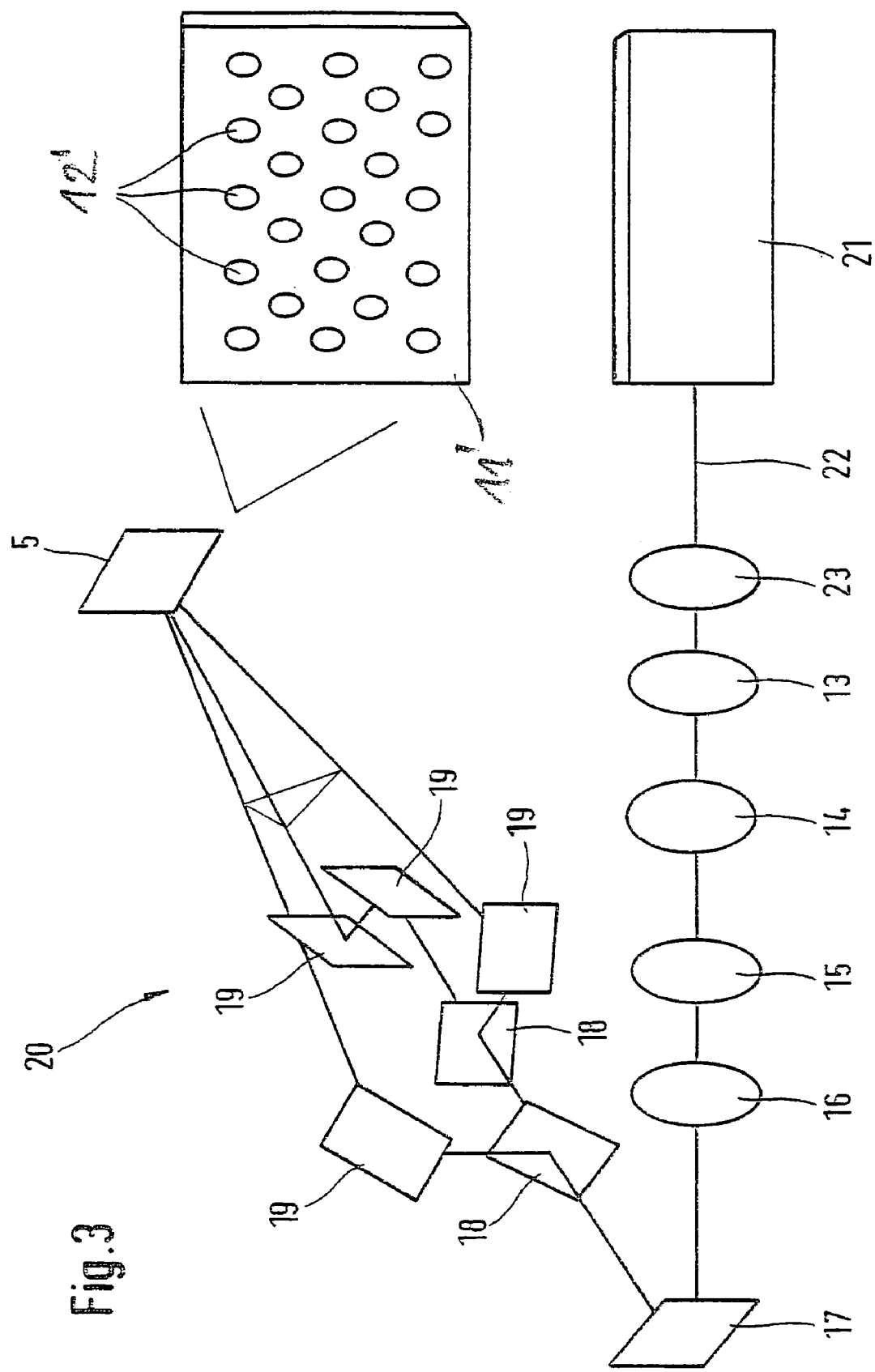

METALLIC SURFACE OF A BODY, METHOD FOR PRODUCING A STRUCTURED METALLIC SURFACE OF A BODY AND THE USE THEREOF

FIELD OF THE INVENTION

The present invention relates to a metallic surface of a body, particularly a contact region or a surface of a plug or a plug connection, of a detachable, especially a detachably lifted off or detachably sliding electrical contact element such as a relay or a switch, or an element for making electrical contact or electrical connection of component parts, a method for producing a structured metallic surface of a body as well as its use.

BACKGROUND INFORMATION

At the present time, in the automobile field, as surfaces for electrical contact elements and plugs, for example, tin surfaces are predominantly used, i.e. hot-dipped substrate or substrate having a galvanically deposited tin layer in a range of thickness of a few micrometers. In this context, tin stands out by its ductility as well as very good electrical conductivity.

As base material or substrate for electrical plug connectors or plugs having a surface tin layer, alloys are used as a rule, that are copper-based, such as bronze, so that an intermediate layer develops by diffusion at the boundary between the tin layer and the substrate, which is made up of an intermetallic compound, such as a compound of the composition $CuSn_3$, $Cu_5Sn_6$. This is harder than the tin layer that is located over it and is able to grow too, depending on the temperature.

Finally, it is known that one may apply a layer made of so-called "Thermotin" onto plugs and/or plug contacts, i.e. a layer based on intermetallic phases with tin that has been created by hot exposure. Because of their low hardness and their low resistance to wear, as is well known, tin alloys, when subjected to frequently repeated plugging or vehicle-caused or engine-caused vibrations, tend to fraying as well as to intensified oxidation (friction oxidation), which, in the case of a motor vehicle may lead to the failure of a component, especially a sensor, a control unit or another type of electrical component.

In known surfaces of plug connections that are based on tin, it is also of disadvantage that the insertion forces that come about due to the great tendency to adhesion and plastic deformability are frequently very great.

SUMMARY OF THE INVENTION

The metallic surface of a body, according to the present invention, and the method, according to the present invention, for preparing a structured metallic surface of a body, has the advantage, compared to the related art, that an intermetallic compound is produced because of a heat input into locally specified regions of the surface of the metallic body, especially via a brief period of laser treatment, and there locally, above all via induced diffusion processes, whereby the structure of the metal that is present there changes at the same time, whereas in the surface regions that are at least to a great extent not exposed to the heat input, the formation of this intermetallic compound does not take place, at least to a great extent.

In this context, depending on the setting of the laser being used, both the depth of formation of the intermetallic compound and its lateral extension may be set in a defined manner to the microscopic plane. In addition, by the laser setting, the removal quantity or the evaporation in the region of the surface of the irradiated body can also be set, so that, in this fashion, a specified topography of the surface of the body, to which laser light is locally applied, is created.

In the case of the metallic surface of an electrical contact element such as a plug contact or a plug, it is also advantageous that the thickness of the intermetallic compound on the surface of the body, that forms because of the method according to the present invention, is essentially of the same order of magnitude as the typical thickness of a customary tin layer on a base body, such as a material that is based on copper.

Thus it is especially advantageous that, because of the method according to the present invention, a metallic surface having a layer at first made essentially of tin or containing tin is able to be provided on, for example, a base body made of copper or a copper-containing material, in a defined manner, region by region, with an intermetallic tin-copper compound, and then, into this intermetallic tin-copper compound, region by region, surface regions being embedded or sunk in, which, at least essentially, are made of pure tin or, compared to the regions in which the intermetallic tin-copper compound has formed, has at least to a great extent remained unchanged.

The combination, thus generated, of a region by region relatively hard intermetallic phase, present on the surface, and surface regions embedded or sunk therein, having ductile residual tin that has a high electrical conductivity, on the surface of the metallic body, fulfills in a particular manner the electrical properties demanded of wear-resistant metal surfaces, particularly tin surfaces, and furthermore, in the case of their use as plug contacts or plugs, lead to especially low plug-in forces.

Because of the preferably periodical surface topography of the metallic body, obtained according to the present invention, such as in the form of a mound-shaped or a wave-shaped surface topography, it is also of advantage that micro-motions of such a plug or plug contact are clearly reduced during vibrational stressing.

Besides that, it is advantageous in this connection if the surface regions created form an especially lattice-like and/or periodical pattern of islands or regions integrated into or embedded in the intermetallic compound, or a pattern of linear channels integrated into or embedded in the intermetallic compound, or a mixture of these patterns.

For the defined local and microscopic generation of the desired regions having the intermetallic compound and of the surface regions in the surface of the metallic body, advantageously a high power laser having sufficient coherence length and a post-connected imaging device is used, so that, by beam splitting, several, such as two or four coherent beam components are able to be generated which, by interference, make available locally periodical, sufficiently high laser intensities. The absorption of the local laser intensities then supplies, locally limited, the energy for a specified intermetallic phase formation and/or a local fusion right up to evaporation, and consequently the formation of the desired, especially periodic surface topography.

In this context, especially by a different number of coherent beam components and/or a different spatial interference angle between the beam components, in a very simple manner, one may generate or pattern out, for example, periodic dotted or lineal patterns such as "holes" or the above-mentioned "islands" or "channels" or other patterns largely at will, which are based on a periodic phase array and/or a periodic topography effect.

By the way, it is advantageous that the metallic surfaces of the body according to the present invention demonstrate a clear increase in hardness, confirmed by Nanointender measurements compared to their state before structuring, using the method according to the present invention.

By the use of pulsed high-energy lasers, such as Nd:YAG lasers, it is advantageously possible to make such a high power locally available that, using one "shot" having a duration of only some nanoseconds, a surface of typically 1 mm$^2$ can be processed, so that the method according to the present invention is also suitable for mass production.

BRIEF DESCRIPTION OF THE DRAWINGS

FIG. 3 shows the construction of the imaging device for making an application to the surface of a body within the scope of a laser interference method.

DETAILED DESCRIPTION

Figure 1:
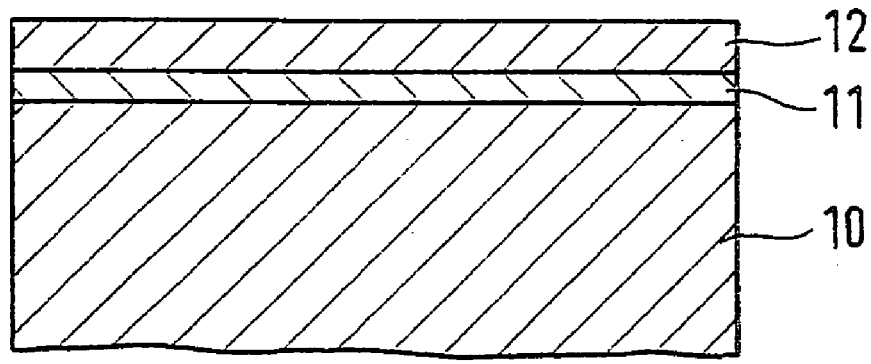
FIG. 1 shows a principle sketch of a section through a metallic surface of a body before it has the method according to the present invention applied to it.

FIG. 1 shows a base body or a substrate 10 made of mostly any desired material, such as a metal such as copper, bronze, brass, CuNiSi, an iron alloy or a particularly stainless spring steel, on which there is located a first intermetallic layer 11, which, in the explained example, is made of a copper-tin alloy. On the first intermetallic layer 11 there is also a metal layer 12, which, in the explained example, is a tin layer.

Figure 2:
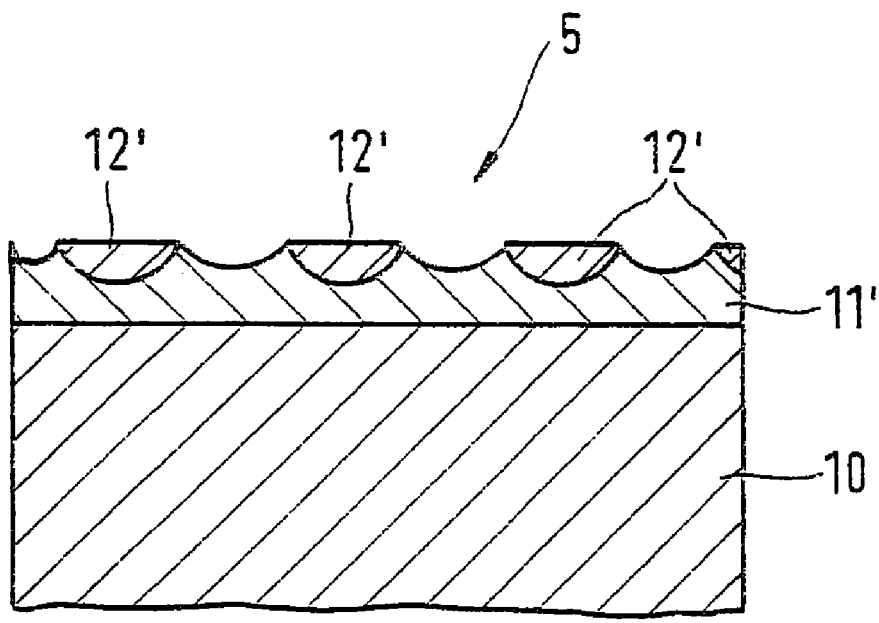
FIG. 2 shows the surface according to FIG. 1 after it has the method according to the present invention applied to it as a principle sketch.

FIG. 2 shows how, after the application to the surface of the body, according to FIG. 1, within the scope of a laser interference method using laser beams and using an imaging device 20 according to FIG. 3, in the region of metallic surface 5 of the body to which the application was made, surface regions 12' have been created which are made at least largely of tin, and which essentially correspond in their composition to tin layer 12 according to FIG. 1. By contrast, in the surroundings of surface regions 12', because of the application using laser beams, first intermetallic layer 11 and metal layer 12 according to FIG. 1 are fused or heat treated in a defined way, generally for making possible a sufficiently great diffusion so that from this an intermetallic compound 11' has formed, i.e., in the explained example, a copper-tin alloy.

The lateral extension of surface regions 12' according to FIG. 2 amounts typically to 500 nm to 50 μm, in particular 1 μm to 20 μm, and, starting from surface 5 of the body, they have a typical depth of 100 nm right up to the thickness of layer 11' formed by intermetallic compound 11', and preferably 500 nm to 5 μm.

The thickness of the layer formed by intermetallic compound 11' according to FIG. 2 amounts, as a rule, to more than 500 nm. In particular, it lies between 1 μm to 20 μm, their thickness corresponding at least approximately to the sum of the thicknesses of first intermetallic layer 11 and metallic layer 12.

In FIG. 2 in section one may clearly recognize that surface regions 12', starting from surface 5 of the body, extend into intermetallic compound 11', and are embedded in it. It is also recognizable that surface regions 12' are developed in the form of islands, which in a top view on FIG. 2 are arranged either regularly or irregularly, and thus form a pattern of islands and/or also lineal channels or a mixture of these patterns. These islands, at the low end, may extend all the way to substrate 10.

Because of the local energy input of the laser, as shown in FIG. 2, locally in the region of intermetallic compound 11', evaporation and a structuring developed in the fluid phase have also come about, so that the previously planar surface 5 of the body according to FIG. 2 now has, for example, a mound-shaped or wave-shaped topography which, depending on the arrangement of surface regions 12', is preferably periodic. In this context, the concrete embodiment of the topography achieved is hardly subject to limitations, and, in an individual case, and may easily be adapted to the desired application.

By the way, it is clear that the method explained is suitable both for structuring metallic surfaces 5 and generally for structuring close to a surface or generating metallic structures. It is particularly suitable for the surface structuring of contact surfaces, especially for plugs, electrical contact elements, detachably removable electrical contact elements such as relays, detachably sliding electrical contact elements such as switches or other electrical connecting elements. It is also clear that surface regions 12', in deviation from FIG. 2, are also able to extend in depth down to substrate 10.

By the way, it should be emphasized that, besides the metals Cu and Sn explained in exemplary fashion or alloys or intermetallic compounds with these metals, other metals such as Ag, Ni, Fe, Ru, Zr, Au or Al, as well as alloys or intermetallic compounds with these metals come into consideration as the material for intermetallic layer 11 or metallic layer 12.

Furthermore, in many cases it is expedient if, between substrate 10 and first intermetallic layer 11, there is at least one further intermediate layer, such as an adhesion layer, or a multi-layer system.

FIG. 3 explains in detail the generation of the metallic surface according to FIG. 2, and the execution of the method according to the present invention by the example of a metallic surface 5, which is shown once more next to it, enlarged to make it clear in a top view. There one may clearly see, in a view corresponding to a top view onto FIG. 2, the periodic arrangement of surface regions 12' in the form of islands in a layer made of intermetallic compound 11'. To go into detail, according to FIG. 3 a usual Nd:YAG laser is provided which is pulsed at a wavelength such as 355 nm having a power of 200 mW and a pulse duration of 10 ns. In this manner, a surface topography is created having typical heights and depths of the mounds or the waves in the range of 50 nm to 500 nm.

A laser beam 22 starts out from laser 21 according to FIG. 3, which reaches a mechanical shutter 14 via an λ/2 plate 23 and a downstream polarizer 13, and the shutter effects a pulsing of laser beam 22. Two optical imaging lenses 15, 16 are postconnected to shutter 14, which image laser beam 22 via a deflecting mirror 17 to a first beam divider 18, which divides laser beam 22 into a first beam supplied to a mirror 19 and a second beam supplied to a second beam divider 18. The second beam is then again divided by second beam divider 18, and is supplied on the one hand to a mirror 19, and on the other hand to two additional mirrors 19. Thus, overall, laser beam 22 is divided up into three laser beams that have an effect on metallic surface 5, that interfere with one another, so that there, in the manner of known laser interference methods, a locally specified heat input into surface 5 takes place.

What is claimed is:

1. A metallic surface of a body, comprising:
an intermetallic compound; and
surface regions that include one of a metal and a metal alloy that is different from the intermetallic compound, wherein:
in the case of one of islands and regions, the surface regions have a lateral extension of 500 nm to 50 μm, and
in the case of lineal channels, the surface regions have a width of 100 nm to 100 μm.

2. The metallic surface as recited in claim 1, wherein:
the metallic surface corresponds to one of:
one of a contact region and a surface of one of a plug and a plug connector of a detachable electrical contact element that is one of disengageable and slideable, and
an element for one of an electrical contacting and a connection of component parts.

3. The metallic surface as recited in claim 1, wherein:
the intermetallic compound includes at least one of Cu, Sn, Ag, Ni, Fe, Ru, Zr, Au, Al, and an alloy containing at least two of Cu, Sn, Ag, Ni, Fe, Ru, Zr, Au, and Al.

4. The metallic surface as recited in claim 3, wherein the intermetallic compound one of:
contains tin and copper,
contains an alloy with tin and copper, and
is made at least essentially of tin and copper.

5. The metallic surface as recited in claim 1, further comprising:
a substrate on which a layer of the intermetallic compound is provided, into which the surface regions are sunk in according to an embedded manner.

6. The metallic surface as recited in claim 5, wherein:
the substrate includes at least one of copper, steel, and an iron alloy.

7. The metallic surface as recited in claim 5, wherein:
the layer made of the intermetallic compound has a thickness of 500 nm to 20 μm.

8. The metallic surface as recited in claim 5, wherein:
the layer made of the intermetallic compound has a thickness of 1 μm to 10 μm.

9. The metallic surface as recited in claim 1, wherein:
the surface regions at least one of extend from a surface of the body into the intermetallic compound and are embedded therein.

10. The metallic surface as recited in claim 1, wherein:
the surface regions include one of:
a lattice like pattern of one of islands and regions that are one of integrated and embedded into the intermetallic compound,
a pattern of lineal channels one of integrated and embedded into the intermetallic compound, and
a mixture of the lattice-like patterns and the lineal channels.

11. The metallic surface as recited in claim 1, wherein:
the surface regions, starting from the surface of the body, extend to a depth of 100 nm to 20 μm into the intermetallic compound.

12. The metallic surface as recited in claim 1, wherein:
the surface regions, starting from the surface of the body, extend to a depth of 500 nm to 5 μm into the intermetallic compound.

13. The metallic surface as recited in claim 1, wherein:
the metallic surface has one of mound shaped topography and a wave shaped topography.

14. A metallic surface of a body, comprising:
an intermetallic compound; and
surface regions that include one of a metal and a metal alloy that is different from the intermetallic compound, wherein:
in the case of one of islands and regions, the surface regions have a lateral extension of 1 μm to 20 μm, and
in the case of lineal channels, the surface regions have a width of 10 μm to 50 μm.

15. A method for preparing a structured metallic surface of a body, comprising:
generating, on one of a first metal layer and a first intermetallic layer, one of a second metal layer and a second intermetallic layer, the one of the second metal layer and the second intermetallic layer differing from the one of the first metal layer and the first intermetallic layer; and
heating region by region in a location of at least the one of the second metal layer and the second intermetallic layer in such a way that in the location an intermetallic compound is formed using a material of the one of the first intermetallic layer and the first metal layer and a material of the one of the second metal layer and the second intermetallic layer, into which surface regions are one of sunk in and embedded, the surface regions being made of the material of the one of the second metal aver and the second intermetallic layer, wherein:
the heating includes causing an optical imaging device to project briefly laser light of high intensity onto specified regions of the metallic surface, the intermetallic compound being created in regions of the metallic surface exposed to the laser light.

16. The method as recited in claim 15, wherein:
by the region by region heating up of the metallic surface, in the location there is induced a development of one of a periodic mound shaped topography and a wave shaped topography.

17. A method for preparing a structured metallic surface of a body, comprising:
generating, on one of a first metal layer and a first intermetallic layer, one of a second metal layer and a second intermetallic layer, the one of the second metal layer and the second intermetallic layer differing from the one of the first metal layer and the first intermetallic layer; and
heating region by region in a location of at least the one of the second metal layer and the second intermetallic layer in such a way that in the location an intermetallic compound is formed using a material of the one of the first intermetallic layer and the first metal layer and a material of the one of the second metal layer and the second intermetallic layer, into which surface regions are one of sunk in and embedded, the surface regions being made of the material of the one of the second metal layer and the second intermetallic layer, wherein:
the surface regions are one of comparatively little and not heated up compared to neighboring regions taken up by the intermetallic compound.

18. The method as recited in claim 17, wherein:
by the region by region heating up of the metallic surface, in the location there is induced a development of one of a periodic mound shaped topography and a wave shaped topography.

19. A method for preparing a structured metallic surface of a body, comprising:
generating, on one of a first metal layer and a first intermetallic layer, one of a second metal layer and a second intermetallic layer, the one of the second metal layer and the second intermetallic layer differing from the one of the first metal layer and the first intermetallic layer;

heating region by region in a location of at least the one of the second metal layer and the second intermetallic layer in such a way that in the location an intermetallic compound is formed using a material of the one of the first intermetallic layer and the first metal layer and a material of the one of the second metal layer and the second intermetallic layer, into which surface regions are one of sunk in and embedded, the surface regions being made of the material of the one of the second metal layer and the second intermetallic layer; and performing a specified local heating of the metallic surface using an imaging unit with the aid of a laser interference method.

20. The method as recited in claim 19, wherein:

by the region by region heating up of the metallic surface, in the location there is induced a development of one of a periodic mound shaped topography and a wave shaped topography.

\* \* \* \* \*

UNITED STATES PATENT AND TRADEMARK OFFICE
CERTIFICATE OF CORRECTION

PATENT NO. : 7,063,896 B2
APPLICATION NO. : 10/489837
DATED : June 20, 2006
INVENTOR(S) : Frank Mücklich et al.

It is certified that error appears in the above-identified patent and that said Letters Patent is hereby corrected as shown below:

Column 6, line 27 change "metal aver" to --metal layer--

Signed and Sealed this

Thirtieth Day of October, 2007

JON W. DUDAS
*Director of the United States Patent and Trademark Office*